(12) United States Patent
Shim et al.

(10) Patent No.: US 7,804,240 B2
(45) Date of Patent: Sep. 28, 2010

(54) ORGANIC ELECTRO LUMINESCENCE DEVICE AND METHOD OF FABRICATING THE SAME

(75) Inventors: Hong-Shik Shim, Yongin-si (KR); In-Seo Kee, Yongin-si (KR); Ick-Hwan Ko, Yongin-si (KR); Young-Gu Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 234 days.

(21) Appl. No.: 11/932,868

(22) Filed: Oct. 31, 2007

(65) Prior Publication Data

US 2008/0238301 A1    Oct. 2, 2008

(30) Foreign Application Priority Data

Mar. 30, 2007    (KR) .................. 10-2007-0031932

(51) Int. Cl.
*H01J 1/62* (2006.01)

(52) U.S. Cl. ...................................... 313/504; 313/506
(58) Field of Classification Search ................ 313/498, 313/504, 506, 512
See application file for complete search history.

(56) References Cited

U.S. PATENT DOCUMENTS

2004/0232832 A1* 11/2004 Kubota ........................ 313/512

* cited by examiner

*Primary Examiner*—Vip Patel
(74) *Attorney, Agent, or Firm*—Cantor Colburn LLP

(57) ABSTRACT

An organic electro luminescence device includes a light emission unit disposed on a substrate and a passivation film including a plurality of organic films and a plurality of inorganic films, the plurality of organic films and the plurality of inorganic films are alternately stacked to cover the light emission unit on the substrate, wherein a side of the passivation film disposed between an edge of the substrate and an edge of the light emission unit is gradually thinner from the edge of the light emission unit towards the edge of the substrate.

6 Claims, 4 Drawing Sheets

ORGANIC ELECTRO LUMINESCENCE DEVICE AND METHOD OF FABRICATING THE SAME

This application claims priority to Korean Patent Application No. 10-2007-0031932, filed on Mar. 30, 2007, and all the benefits accruing therefrom under 35 U.S.C. §119, the contents of which in its entirety are herein incorporated by reference.

BACKGROUND OF THE INVENTION

1. Field of the Invention

The present invention relates to an organic electro luminescence device and a method of fabricating the same, and more particularly, to a sealing structure which blocks a penetration of moisture or oxygen from edges of a display panel in an organic electro luminescence device, and a method of fabricating the same.

2. Description of the Related Art

Organic electro luminescence devices are display devices which form an image using light emitted from an organic light emitting layer formed between an anode electrode and a cathode electrode when holes supplied from the anode electrode and electrons supplied from the cathode electrode are combined in the organic light emitting layer. These organic electro luminescence devices are expected to be the next generation of flat panel display devices due to their superior display characteristics such as wide viewing angle, short response time and high contrast, in addition to their slim design and low manufacturing costs.

However, an organic material of the organic electro luminescence device may be degraded by moisture and oxygen, and as a result, a light emission efficiency of the light emitting device and a lifespan of the organic electro luminescence device may thereby be reduced. Therefore, a sealing structure for preventing a penetration of moisture and oxygen in a region in which the organic material is disposed is required.

FIG. 1 is a cross-sectional schematic diagram view of a sealing structure of a conventional organic electro luminescence device 10 of the prior art. A cap 14 that covers a light emission unit 12 is formed on a substrate 11, and a sealing material 16 is coated between the cap 14 and the substrate 11. A moisture absorbent 18 is filled in a space between the cap 14 and the substrate 11, and the moisture absorbent 18 absorbs moisture entering into the space.

FIG. 2 is a cross-sectional schematic diagram view of a sealing structure of another conventional organic electro luminescence device 30 of the prior art. Referring to FIG. 2, a light emission unit 32 is formed on a substrate 31, and organic films 41 and 42 and inorganic films 51 and 52 are respectively formed in multiple layers alternately stacked on each other. The inorganic films 51 and 52 block moisture penetration, and the organic films 41 and 42 support a structure of the inorganic films 51 and 52.

The organic electro luminescence device 30 of FIG. 2 does not use a moisture absorbent. However, in the organic electro luminescence device 30, external moisture may penetrate through edges of the organic films 41 and 42 formed parallel to the substrate 31, in particular, through edges of the organic film 41 which contacts the light emission unit 32, and thus the light emission unit 32 may thereby be degraded. Therefore, in order to reduce a degradation of the light emission unit 32, a distance d1 from the light emission unit 32 to the edge of the substrate 31 may be increased. However, the increase in the distance d1 from the light emission unit 32 to the edge of the substrate 31 may increase a size of the organic electro luminescence device 30, and, when a plurality of light emission units are diced, a productivity of the organic electro luminescence device is thereby reduced.

BRIEF SUMMARY OF THE INVENTION

To solve the above and/or other problems, the present invention provides a sealing structure of an organic electro luminescence device which may prevent a penetration of moisture and oxygen from an external environment and the sealing structure includes a reduced distance from the light emission unit and an edge of a substrate.

The present invention provides a method of fabricating the sealing structure as discussed above.

According to an exemplary embodiment of the present invention, there is provided an organic electro luminescence device including a light emission unit disposed on a substrate and a passivation film including a plurality of organic films and a plurality of inorganic films, the plurality of organic films and the plurality of inorganic films are alternately stacked to cover the light emission unit on the substrate, wherein a side of the passivation film disposed between an edge of the substrate and an edge of the light emission unit facing the edge of the substrate is gradually thinner from the edge of the light emission unit towards the edge of the substrate.

In exemplary embodiments, the side of the passivation film disposed between the edge of the substrate and the edge of the light emission unit may constantly taper from the edge of the light emission unit towards the edge of the substrate when viewed in a cross-section.

Each of the inorganic films of the plurality of inorganic films may have a uniform thickness.

First organic film which contacts the light emission unit among the plurality of the organic films may be gradually thinner or constantly taper from the edge of the light emission unit towards the edge of the substrate, and an edge of the first organic film may be separated from the edge of the substrate.

The plurality of the organic films may be gradually thinner or constantly taper from the edge of the light emission unit towards the edge of the substrate, and an edge of the first organic film which contacts the light emission unit may be separated from the edge of the substrate.

The first organic film contacting the light emission unit among the plurality of the organic films may include a polymer selected from the group consisting of polyurea, polyamic acid and polyimide According to an exemplary embodiment of the present invention, there is provided a method of fabricating an organic electro luminescence device which includes a light emission unit disposed on a substrate and a passivation film including a plurality of organic films and a plurality of inorganic films, the plurality of organic films and the plurality of inorganic films are alternately stacked to cover the light emission unit on the substrate, wherein a side of the passivation film disposed between an edge of the substrate and an edge of the light emission unit is gradually thinner or constantly tapers from the edge of the light emission unit towards the edge of the substrate, the method includes forming a first organic film which contacts the light emission unit gradually thinner or constantly tapers from the edge of the light emission unit towards the edge of the substrate.

The forming of the first organic film may include forming a temperature gradient between the edge of the light emission unit and the edge of the substrate, supplying two gas phase monomers to the substrate to form a polymer and forming the polymer on the substrate.

According to an exemplary embodiment of the present invention, the forming of the temperature gradient may include heating the edge of the substrate by disposing a heater to correspond to the edge of the substrate.

According to another exemplary embodiment of the present invention, the forming of the temperature gradient may include forming the temperature gradient from the edge of the light emission unit towards the edge of the substrate by applying heat to a region corresponding to the light emission unit by disposing a heater to correspond to the light emission unit.

The method may further include changing the polyamic acid into polyimide by heating the polyamic acid.

The method may include alternately disposing the plurality of inorganic films and the plurality of the organic films, excluding the first organic film, on the first organic film, wherein the plurality of the organic films are gradually thinner or constantly tapers from the edge of the light emission unit towards the edge of the substrate.

The forming of each organic film of the plurality of the organic films may include forming the temperature gradient between the edge of the light emission unit and the edge of the substrate, supplying two gas phase monomers to the substrate to form a polymer and forming the polymer on the substrate.

BRIEF DESCRIPTION OF THE DRAWINGS

The above and other aspects, features and advantages of the present invention will now become more apparent by describing in detail exemplary embodiments thereof with reference to the accompanying drawings, in which.

DETAILED DESCRIPTION OF THE INVENTION

Figure 1:
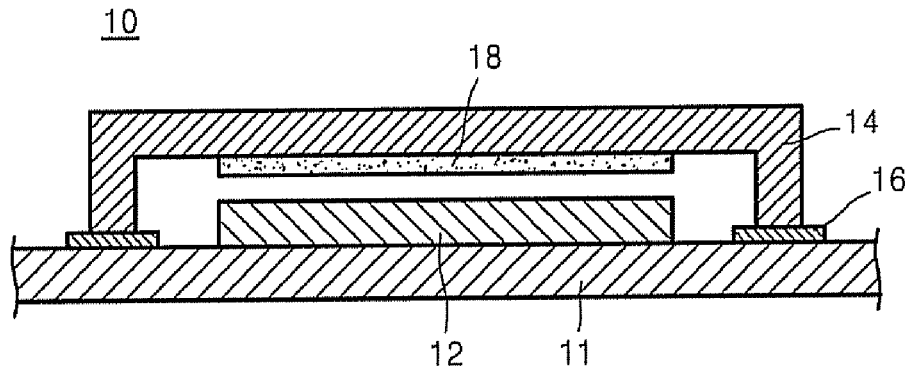
FIG. 1 is a cross-sectional schematic diagram view illustrating a sealing structure of a conventional organic electro luminescence device of the prior art.
Figure 2:
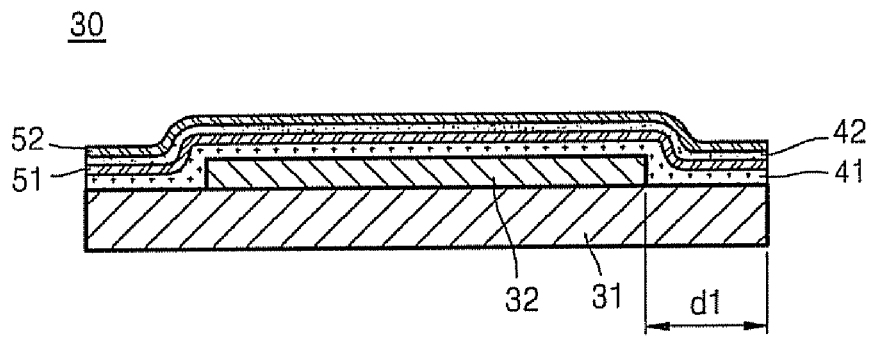
FIG. 2 is a cross-sectional schematic diagram view illustrating a sealing structure of another conventional organic electro luminescence device of the prior art.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

The present invention will now be described more fully with reference to the accompanying drawings in which exemplary embodiments of the invention are shown. In the drawings, the thicknesses of layers and regions are exaggerated for clarity.

Figure 3:
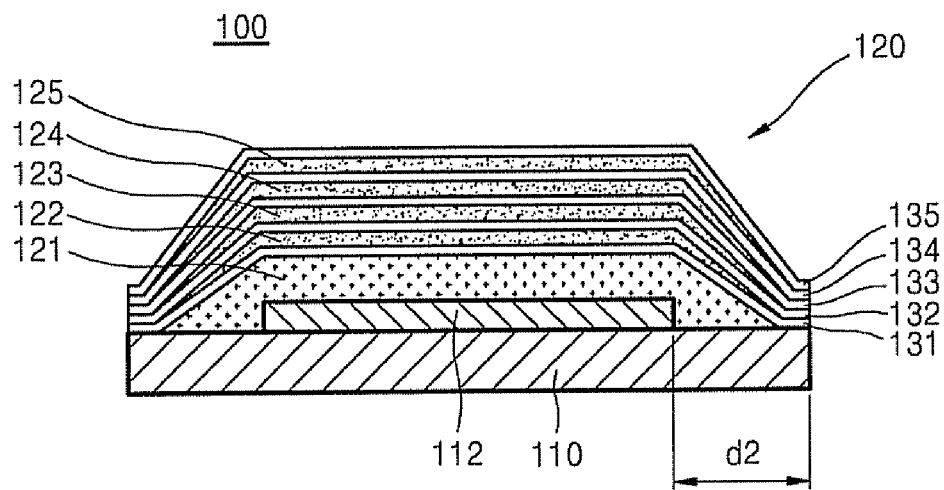
FIG. 3 is a cross-sectional schematic diagram view illustrating an exemplary embodiment of an organic electro luminescence device according to the present invention.

FIG. 3 is a cross-sectional schematic diagram view illustrating an exemplary embodiment of an organic electro luminescence device 100 according to the present invention. Referring to FIG. 3, a light emission unit 112 is formed on a substrate 110. The light emission unit 112 includes an anode electrode (not shown), a cathode electrode (not shown) and an organic light emitting layer (not shown) which is disposed between the anode electrode and the cathode electrode. A passivation film 120 which covers the organic light emitting layer is formed on the substrate 110. The passivation film 120 includes organic films 121 through 125 and inorganic films 131 through 135 alternately stacked onto each other on the light emission unit 112. The inorganic films 131 through 135 prevent or substantially reduce a penetration of moisture and oxygen from an external environment, and the organic films 121 through 125 support a structure of the inorganic films 131 through 135.

In exemplary embodiments, the first organic film 121 which contacts the light emission unit 112 may be formed to a thickness of approximately a few hundredths of a nanometer (nm) to a few micrometers (μm). The first organic film 121 is angled by a predetermined angle between an edge of the substrate 110 and an edge of the light emission unit 112. That is, in exemplary embodiments, the first organic film 121 is formed gradually thinner or constantly tapers from the edge of the light emission unit 112 towards the edge of the substrate 110, and an edge of the first organic film 121 may be formed between the edge of the light emission unit 112 and the edge of the substrate 110. Although FIG. 3 illustrates only two sides of the first organic film 121 formed gradually thinner or constantly tapers from the edge of the light emission unit 112 towards the edge of the substrate 110, one of ordinary skill in the art would recognize that all four sides which surround the light emission unit 112 may also include a gradually thinner or constantly tapers first organic film 121 from corresponding edges of the light emission unit 112 towards corresponding edges of the substrate 110. In exemplary embodiments, the first organic film 121 may be formed of a polymer. In further exemplary embodiments, the first organic film 121 may be formed of polyurea, polyamic acid, or polyimide. However, the first organic film 121 of the present invention is not limited thereto.

The first inorganic film 131 covers the first organic film 121 and extends substantially toward the edge of the substrate 110 in exemplary embodiments, the first inorganic film 131 may be formed of alumina and formed to include a uniform thickness on the first organic film 121.

In exemplary embodiments, the second organic film 122 is formed on the first inorganic film 131, and may be formed of a same material as the first organic film 121. In further exemplary embodiments, the second organic film 122 may be formed gradually thinner from the edge of the light emission unit 112 towards the edge of the substrate 110 substantially similar to the first organic film 121, and the second organic film 122 may be separated from the edge of the substrate 110.

Next, the second through fifth inorganic films 132 through 135 are stacked substantially similar as the first inorganic film 131, and also, the second through fifth organic films 122 through 125 are stacked in a substantially similar manner as the first organic film 121. Accordingly, the passivation film 120 is formed gradually thinner or constantly tapers from the edge of the light emission unit 112 towards the edge of the substrate 110.

Due to the angled first through fifth organic films 121 through 125, edges of the first through fifth inorganic films 131 through 135 disposed between the first through fifth organic films 121 through 125 are gathered on the edge of the substrate 110. The first through fifth inorganic films 131 through 135 prevents or substantially reduces a penetration of moisture and oxygen from an external environment and thereby effectively protects the light emission unit 112.

In an exemplary embodiment of a sealing structure according to the present invention, a distance d2 from the light emitting device to the edge of the substrate 110 is shorter as compared to a distance d1 of the conventional organic electro luminescence device of the prior art. Thus, a dead space of the substrate 110 may be reduced, thereby increasing a yield thereof when a plurality of light emitting devices are manufactured on a wafer.

The reduction of dead space of the substrate 110 may therefore lead to a reduction of a distance between pixels when the organic electro luminescence devices 100 are used for a multi-display apparatus, thereby minimizing a discontinuity of the pixels within the display.

An exemplary embodiment of a method of fabricating an exemplary embodiment of an organic electro luminescence device 100 according to the present invention will now be described.

Figure 4:
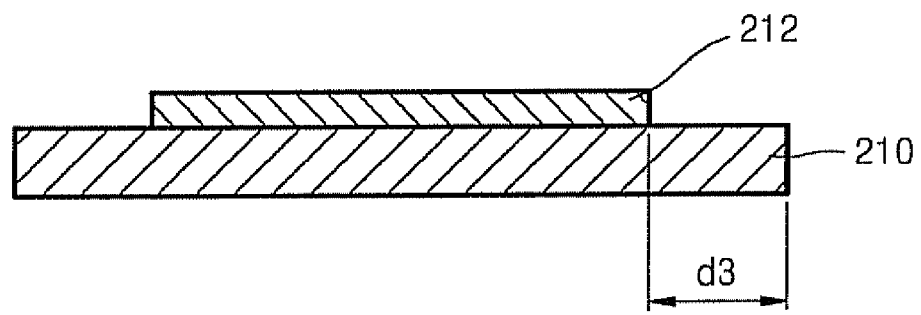
FIGS. 4 and 7 are cross-sectional schematic diagram views illustrating an exemplary embodiment of a method of fabricating an exemplary embodiment of an organic electro luminescence device according to the present invention.

FIG. 4 is a cross-sectional schematic diagram view illustrating a method of fabricating the organic electro luminescence device 100 according to the present invention. Referring now to FIG. 4, a light emission unit 212 is formed on an active region of a substrate 210 such as a glass substrate or a plastic substrate. In exemplary embodiments, the substrate 210 may be formed in a wafer scale. In exemplary embodiments, pixels which include red, green and blue color sub-pixels are formed in the active region of the substrate 210. In further exemplary embodiments, a distance d3 between the active region and the edge of the substrate 210 may be formed to approximately 1 mm.

Figure 5:
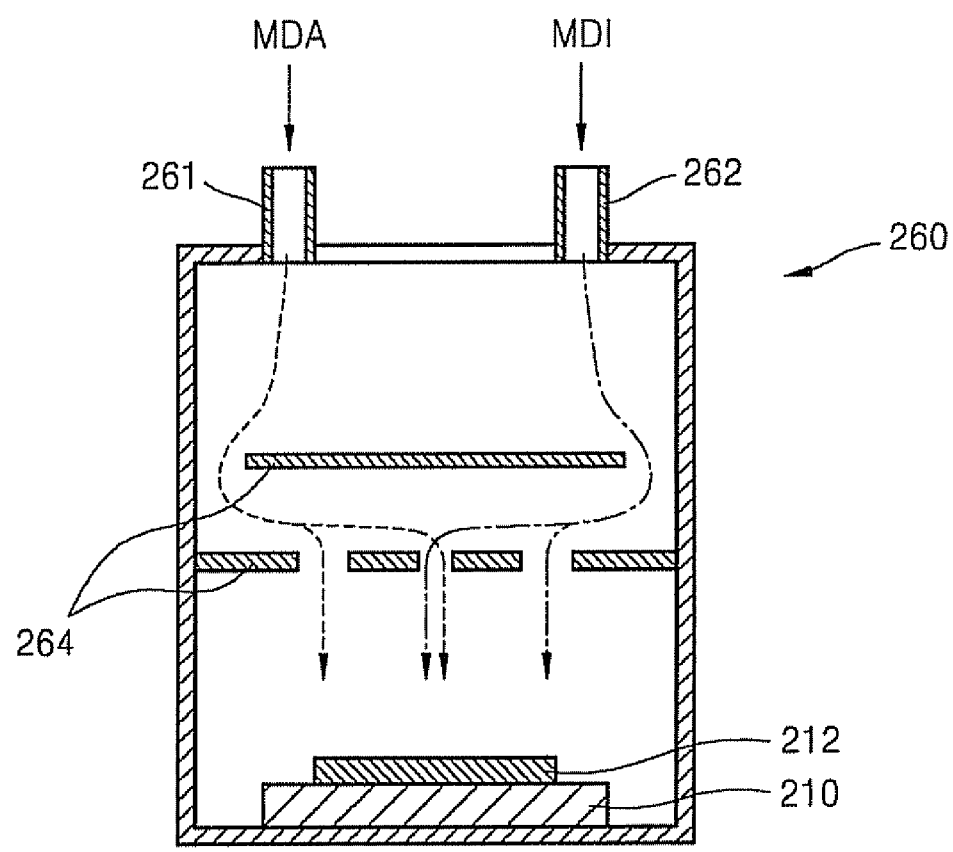
FIG. 5 is a cross-sectional schematic diagram view illustrating a vapor phase thermal polymerization chamber.

Next, the substrate 210 is placed in a vapor phase thermal polymerization chamber 260. FIG. 5 is a cross-sectional schematic diagram illustrating the vapor phase thermal polymerization chamber 260. Referring now to FIG. 5, the vapor phase thermal polymerization chamber 260 is maintained in a vacuum state or in an inert gas atmosphere. The vapor phase thermal polymerization chamber 260 includes two inlet pipes 261 and 262, and gas phase monomers of 4,4'-methylenedianiline and methylene di(p-phenylene) diisocyanate ("MDI") are supplied to the vapor phase thermal polymerization chamber 260 through the inlet pipes 261 and 262. The gas phase monomers supplied to the vapor phase thermal polymerization chamber 260 are mixed in a mixer 264. Then, the gas phase monomers are polymerized to polyurea on the substrate 210 which is maintained at a predetermined temperature, and the polyurea covers the light emission unit 212. In exemplary embodiments the polyurea may be a compound having the following chemical formula 1.

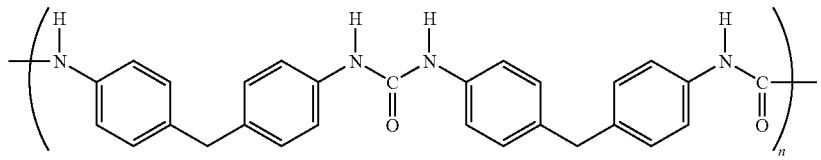

where, n may be a number between 1 and 10,000,000.

At this point, a temperature gradient is formed between an active region of the substrate 210 where the light emission unit 212 is formed and an edge of the substrate 210.

Figure 6:
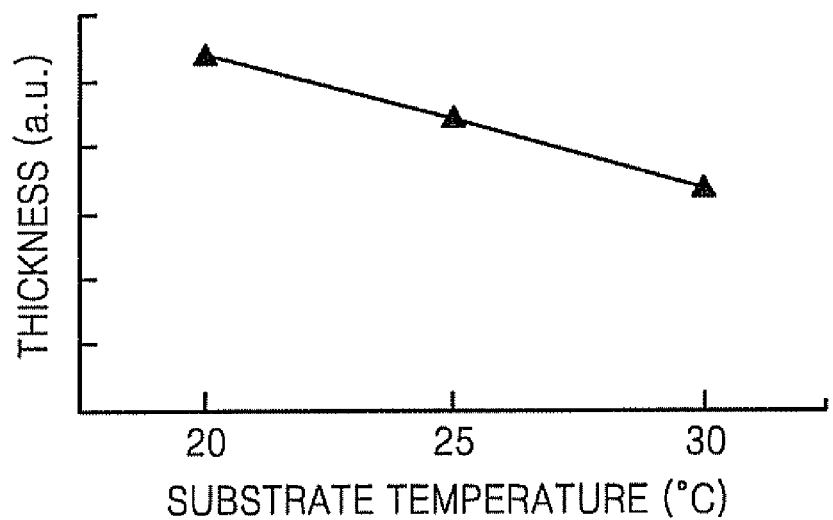
FIG. 6 is a graph illustrating a thickness of polyurea on a substrate according to a temperature gradient between an edge of a light emission unit and an edge of the substrate.

FIG. 6 is a graph illustrating a thickness of polyurea formed on the substrate 210 according to the temperature gradient between the edge of the light emission unit 212 and the edge of the substrate 210. As illustrated in a relative scale in FIG. 6, the thickness of polyurea is a function of temperature.

Referring now to FIG. 6, when the polyurea is polymerized, the thickness of the polyurea is reduced as the temperature of the substrate 210 increases.

Figure 7:
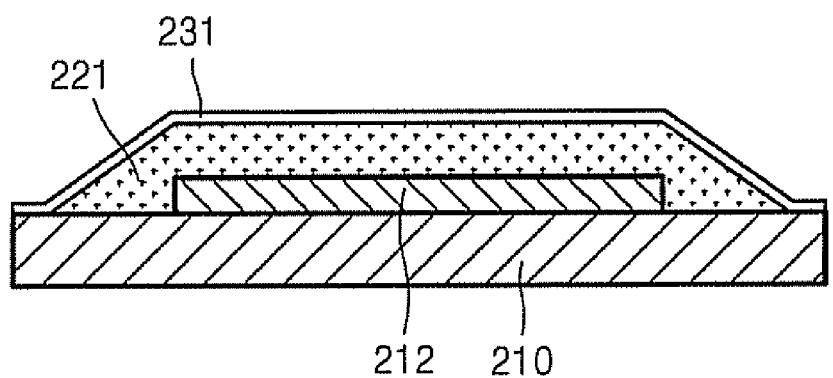

Accordingly, as depicted in FIG. 7, the first organic film 221 includes a thickness gradually thinner from the edge of the light emission unit 212 towards the edge of the substrate 210 as the temperature increases from the edge of the light emission unit 212 towards the edge of the substrate 210, and an end of the first organic film 221 may be separated from the edge of the substrate 210.

In an exemplary embodiment, in order to form the first inorganic film 231 on the first organic film 221, the substrate 210 is placed in a deposition chamber, for example, a chemical vapor deposition ("CVD") chamber, and afterwards, the first inorganic film 231 is deposited to a uniform thickness using a well known deposition process in the semiconductor industry.

The first inorganic film 231 is deposited on the substrate 210 to cover the first organic film 221 including an edge of the first organic film 221, and prevents the first organic film 221 from contacting external moisture and oxygen.

Next, as depicted in FIG. 3, the second through fifth organic films 122 through 125 and the second through fifth inorganic films 132 through 135 are alternately stacked on the first inorganic film 231 using the deposition method as described above. In exemplary embodiments, the second through fifth organic films 122 through 125, except for the first organic film 221, may be formed using a conventional CVD method or physical vapor deposition ("PVD") method.

Figure 8:
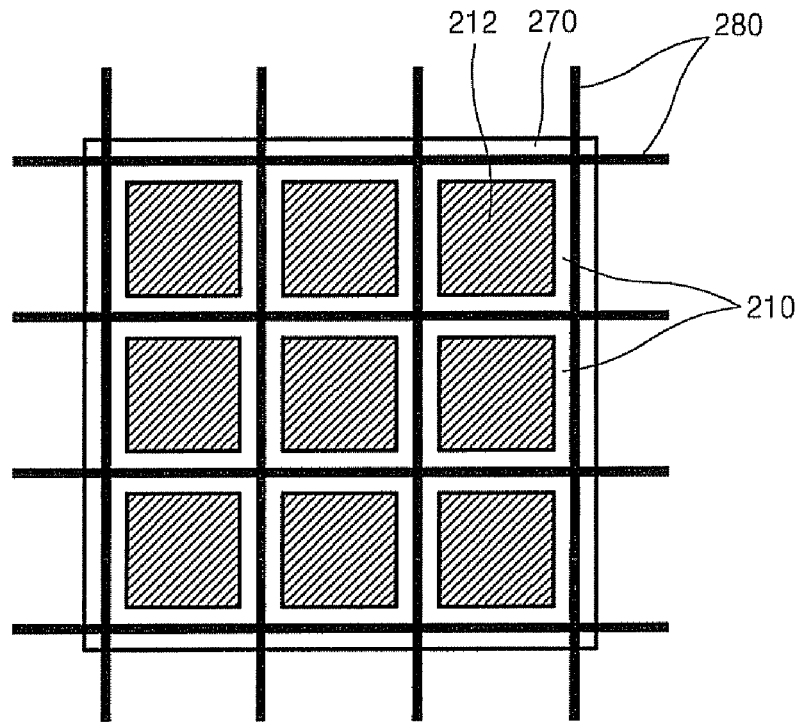
FIGS. 8 and 9 are top plan schematic diagram views illustrating a method of forming a temperature gradient from an edge of the light emission unit to an edge of the substrate.

FIG. 8 is a top plan schematic diagram illustrating a method of forming a temperature gradient from an edge of the light emission unit 212 to an edge of the diced substrate 210, according to an exemplary embodiment of the present invention.

Referring to FIG. 8, heaters, for example, heating wires 280, are formed or disposed between the light emission units 212 and outer areas of the light emission units 212 on a wafer 270. When the heating wires 280 are turned on, temperature gradient regions are formed on the undiced substrates 210 where temperature gradually decreases from edges of the substrate 210 to edges of the light emission unit 212. In exemplary embodiments, the substrates 210 may be formed by dicing the wafer 270 along the heating wires 280.

Another exemplary embodiment of a method of fabricating an exemplary embodiment of an organic electro luminescence device according to the present invention will now be described with reference to FIGS. 4, 5, 7 and 9.

A light emission unit 212 is formed on a substrate 210. In exemplary embodiments, the substrate 210 may be a glass substrate or a plastic substrate. In further exemplary embodiments, the substrate 210 may be formed in a wafer scale.

The substrate 210 is placed in a vapor phase thermal polymerization chamber 260. The vapor phase thermal polymerization chamber 260 includes two inlet pipes 261 and 262, and gas phase monomers of pyromellitic dianhydride ("PMDA") and 4,4'-diaminodiphenyl ether ("DDE") are supplied to the vapor phase thermal polymerization chamber 260 through the inlet pipes 261 and 262. The gas phase monomers entered into the vapor phase thermal polymerization chamber 260 are mixed by a mixer 264 and cover the light emission unit 212 by being polymerized into polyamic acid on the substrate 210, which is maintained at a predetermined temperature.

In an exemplary embodiment, the polyamic acid may be a compound having the following chemical formula 2.

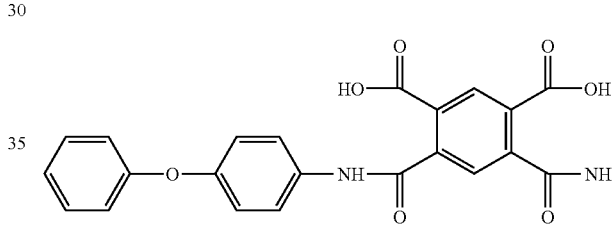

At this point, a temperature gradient may be formed between the light emission unit 212 and an edge of the substrate 210.

Figure 9:
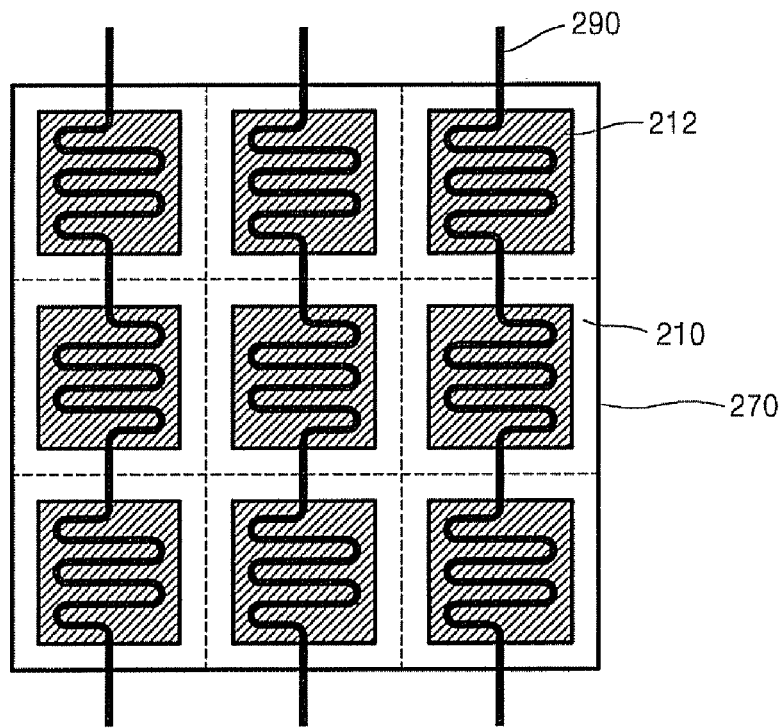

FIG. 9 is a top plan schematic diagram illustrating an exemplary embodiment of a method of forming a temperature gradient between an edge of the light emission unit 212 and the edge of the substrate 210, according to the present invention.

Referring to FIG. 9, heaters 290 are formed or disposed above each of the light emission units 212 on a wafer 270. In exemplary embodiments, the heaters 290 may be heating wires. When the heaters 290 are turned on, a temperature gradient may be formed on the substrates 210 where temperature is gradually reduced from edges of the light emission units 212 to edges of the substrates 210. In further exemplary embodiments, the substrates 210 may be formed by dicing the wafer 270 along the dotted line in FIG. 9.

The first organic film 221 includes a thickness which becomes gradually thinner from the edge of the light emission unit 212 towards the edge of the substrate 210, and an edge of the first organic film 221 may be separated from the edge of the substrate 210.

Next, in order to form the first inorganic film 231 on the first organic film 221, the substrate 210 is placed in a deposition chamber, for example, a CVD chamber, and afterwards, the first inorganic film 231 is deposited using a well known deposition process in the semiconductor industry.

The first inorganic film 231 is deposited on the substrate 210 to cover the first organic film 221 including an edge of the first organic film 221, and the first inorganic film 231 prevents the first organic film 221 from contacting external moisture and oxygen. In exemplary embodiments, the first inorganic film 231 may be formed to a uniform thickness.

Next, the second through fifth organic films 122 through 125 and the second through fifth inorganic films 132 through 135 are alternately stacked on the first inorganic film 231 using the deposition method as described above.

In exemplary embodiments, the second through fifth organic films 122 through 125, except for the first organic film 221, may be formed using a conventional CVD method or PVD method.

When the substrate 210 on which the organic films are formed or the substrate 210 on which the organic films and the inorganic films are formed is annealed, polyamic acid turns into polyimide. Polyimide includes a high physical durability and sealing characteristics and an example of the polyimide may be a compound having the following chemical formula 3.

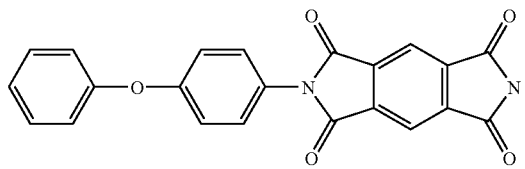

The sealing structure of an organic electro luminescence device according to the present invention prevents a light emission unit from contacting moisture and oxygen. In exemplary embodiments, the organic electro luminescence device having the sealing structure includes a relatively short distance between an edge of the light emission unit and an edge of a substrate, and thus, a dead space is thereby reduced, which increases a yield thereof when a plurality of light emitting devices are formed on a wafer.

In exemplary embodiments, the reduction of the dead space of the substrate may lead to a reduction of a distance between pixels when the organic electro luminescence devices 100 are used for a multi-display apparatus, thereby minimizing a discontinuity of the pixels within the display.

In an exemplary embodiment of a method of fabricating an organic electro luminescence device 100 according to the present invention, a temperature gradient region is formed between the edge of the light emission unit 112 and the edge of the substrate 110. Afterwards, an organic film 121 being composed of polymer is formed gradually thinner from the edge of the light emission unit 112 towards the edge of the substrate 110 using a polymer, and then, an inorganic film 131 is formed on the organic film 121. In exemplary embodiments, the inorganic film 131 prevents the light emission unit from contacting moisture and oxygen in the air.

While the present invention has been particularly shown and described with reference to some exemplary embodiments thereof, it will be understood by those of ordinary skill in the art that various changes in form and details may be made therein without departing from the spirit and scope of the present invention as defined by the following claims.

What is claimed is:

1. An organic electro luminescence device comprising:
a light emission unit disposed on a substrate; and
a passivation film including a plurality of organic films and a plurality of inorganic films, the plurality of organic films and the plurality of inorganic films are alternately stacked to cover the light emission unit on the substrate,
wherein a side of the passivation film disposed between an edge of the substrate and an edge of the light emission unit is gradually thinner from the edge of the light emission unit towards the edge of the substrate, and edges of the plurality of the inorganic films contact each other to seal the plurality of the organic films thereunder.

2. The organic electro luminescence device of claim 1, wherein the side of the passivation film disposed between the edge of the substrate and the edge of the light emission unit constantly tapers from the edge of the light emission unit towards the edge of the substrate when viewed in a cross-section.

3. The organic electro luminescence device of claim 1, wherein each of the inorganic films of the plurality of inorganic films has a uniform thickness.

4. The organic electro luminescence device of claim 1, wherein a first organic film which contacts the light emission unit among the plurality of the organic films is gradually thinner from the edge of the light emission unit towards the edge of the substrate, and an edge of the first organic film is separated from the edge of the substrate.

5. The organic electro luminescence device of claim 1, wherein the plurality of the organic films are gradually thinner from the edge of the light emission unit towards the edge of the substrate, and an edge of a first organic film contacting the light emission unit is separated from the edge of the substrate.

6. The organic electro luminescence device of claim 1, wherein a first organic film contacting the light emission unit among the plurality of organic films is a polymer selected from the group consisting of polyurea, polyamic acid and polyimide.

* * * * *